United States Patent
Yoo

(10) Patent No.: US 8,338,500 B2
(45) Date of Patent: Dec. 25, 2012

(54) BINDER COMPOSITION AND PHOTOSENSITIVE COMPOSITION INCLUDING THE SAME

(75) Inventor: Mikyong Yoo, Santa Clara, CA (US)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 322 days.

(21) Appl. No.: 12/584,669

(22) Filed: Sep. 9, 2009

(65) Prior Publication Data
US 2010/0148134 A1  Jun. 17, 2010

Related U.S. Application Data

(63) Continuation-in-part of application No. 11/625,503, filed on Jan. 22, 2007, now abandoned.

(51) Int. Cl.
| B29C 71/04 | (2006.01) |
| C03C 25/10 | (2006.01) |
| C08F 2/50 | (2006.01) |
| C08F 4/06 | (2006.01) |
| C08F 12/30 | (2006.01) |
| C08F 20/68 | (2006.01) |
| C08F 28/02 | (2006.01) |
| C08F 36/02 | (2006.01) |

(52) U.S. Cl. ............. 522/71; 522/42; 522/46; 522/121; 522/142; 526/146; 526/286; 526/318; 526/318.1

(58) Field of Classification Search ............ 522/71, 522/42, 46, 121, 142; 526/146, 286, 318, 526/318.1
See application file for complete search history.

(56) References Cited

U.S. PATENT DOCUMENTS

| 5,232,634 A * | 8/1993 | Sawada et al. ............. 252/584 |
| 5,489,621 A * | 2/1996 | Sato et al. ............. 522/75 |
| 5,578,413 A * | 11/1996 | Fujikura et al. ............. 430/258 |
| 5,866,298 A * | 2/1999 | Iwamoto et al. ............. 430/281.1 |
| 5,908,720 A * | 6/1999 | Uchikawa et al. ............. 430/6 |
| 6,180,322 B1 * | 1/2001 | Sakurai et al. ............. 430/321 |
| 6,255,034 B1 * | 7/2001 | Shimada et al. ............. 430/281.1 |
| 6,413,686 B2 * | 7/2002 | Kishimoto et al. ............. 430/7 |
| 6,627,364 B2 * | 9/2003 | Kiguchi et al. ............. 430/7 |
| 7,425,585 B2 * | 9/2008 | Kura et al. ............. 522/8 |

* cited by examiner

*Primary Examiner* — Nathan M Nutter
(74) *Attorney, Agent, or Firm* — Altis Law Group, Inc.

(57) ABSTRACT

The present invention relates a binder composition and a photosensitive composition including the binder composition. In one embodiment, a binder composition includes a copolymer of monomer M1, M2, M3, M4, an iso octyl 3-mercaptopropionate and a thermal initiator, wherein the monomer M1 can be represented by the following formula:

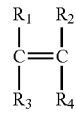

the monomers M2, M3 and M4 can be represented by the following formula, however the monomers M2, M3 and M4 are different from each other,

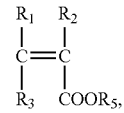

wherein R1, R2, R3 can be selected from the group consisting of hydrogen and alkyl group, R4 is an aromatic group, R5 can be selected from the group consisting of hydrogen, aromatic groups, alkyl groups, substituted alkyl groups and alkyl groups interrupted by an oxygen atom. The copolymer has good developing ability and a black matrices made therefrom has good mechanical properties.

15 Claims, No Drawings

BINDER COMPOSITION AND PHOTOSENSITIVE COMPOSITION INCLUDING THE SAME

CROSS-REFERENCE TO RELATED APPLICATIONS

This Application is a continuation-in-part of U.S. patent application Ser. No. 11/625,503, filed on Jan. 22, 2007, and titled, BINDER COMPOSITION AND PHOTOSENSITIVE COMPOSITION INCLUDING THE SAME. The disclosure of the above identified application is incorporated herein by reference.

BACKGROUND

1. Technical Field

The present invention relates to a binder composition for black matrices and a photosensitive composition including the binder composition.

2. Discussion of Related Art

Color filters are widely used in color television sets, liquid crystal display devices, solid image pickup devices, cameras and so forth for separating several types of light having different colors, for example, red, green and blue, from while light. Typically, a color filter includes three or more different hue patterns formed on a transparent substrate and a black matrices. Usually, the hue patterns include red pattern (R), green pattern (G) and blue pattern (B) with a precision of several micrometers (μm). The black matrices are arranged between such hue patterns for separating such hue patterns from each other so as to increase the color contrast of the color filter.

A thin metal film, for example, chromium (Cr), Nickel (Ni), and aluminium (Al) can be used for black matrices. Black matrices made of metal film have excellent light-shielding properties. However, it is too complicated, expensive and hazardous to process this metal.

Therefore, black matrices have been developed using a black pigment and a photosensitive resin, which is cured by ultraviolet radiation and etched using alkaline developing solution. In the development step (i.e., chemical treatment of exposed photo-sensitive sections), the unnecessary pigment and resin components must be dissolved in the alkaline developing solution timely. However, problems may occur when the unnecessary pigment and resin components still remains after developing or are dissolved too quickly for the developing process to be carried out properly.

Therefore, it is desired to synthesize a binder that can be developed in a desired time of developing process for black matrices and a photosensitive composition for black matrices including the binder.

DETAILED DESCRIPTION

A photosensitive composition for color filter black matrices in accordance with a preferred embodiment includes a binder composition, a photopolymerization initiator, a crosslinkable monomer, an organic solvent, and a black pigment.

The binder composition for black matrices includes a copolymer of monomer M1, M2, M3, M4, an iso octyl 3-mercaptopropionate, and a thermal initiator. A weight percentage of the monomer M2 is in the approximate range from 54.15% to 84.5%. A weight percentage of the monomer M3 is in the approximate range from 10.02% to 15.1%. A weight percentage of the monomer M4 or the monomer M1 is in the approximate range from 0% to 27.08%. A weight percentage of the iso octyl 3-mercaptopropionate is in the approximate range from 0.7% to 9.57%. A weight percentage of the thermal initiator is in the approximate range from 0.56% to 5.42%. The monomer M1 can be represented by the following formula:

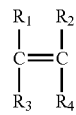

Wherein R1, R2, and R3 can be selected from the group consisting of hydrogen atom and alkyl group having 1 to 4 carbon atoms. R4 can be aromatic group.

Illustrative examples of monomer M1 include aromatic vinyl compounds such as styrene, α-methylstyrene, o-vinyltoluene, m-vinyltoluene, p-vinyltoluene, p-chlorostyrene, o-methoxystyrene, m-methoxystyrene, p-methoxystyrene, o-vinylbenzyl methyl ether, m-vinylbenzyl methyl ether, p-vinylbenzyl methyl ether, o-vinylbenzyl methyl ether, m-vinylbenzyl glycidyl ether, and p-vinylbenzyl glycidyl ether.

The monomers M2, M3 and M4 can be represented by the following formula, however the monomers M2, M3, and M4 are different from each other:

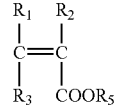

Wherein R1, R2, and R3 can be selected from the group consisting of hydrogen atoms and alkyl groups having 1 to 4 carbon atoms. R5 can be selected from hydrogen atoms, alkyl groups having 1 to 4 carbon atoms, substituted alkyl groups, oxygen interrupted alkyl groups, aromatic groups and alkyl substituted aromatic groups.

Illustrative examples of the monomer M2 include benzyl acrylate, and benzyl methacrylate.

Illustrative examples of the monomer M3 include acrylic acid, methacrylic acid, crotonic acid, α-chloroacrylic acid and cinnamic acid.

Illustrative examples of the monomer M4 include 2-hydroxyethyl acrylate, 2-hydroxyethyl methacrylate, 2-hydroxypropyl acrylate, 2-hydroxypropyl methacrylate, 3-hydroxypropyl acrylate, 3-hydroxypropyl methacrylate, 3-hydroxypropyl acrylate, 3-hydroxypropyl methacrylate, 2-hydroxybutyl acrylate, 2-hydroxylbutyl methacrylate, 3-hydroxybutyl acrylate, 3-hydroxybutyl methacrylate, 4-hydroxybutyl acrylate, 4-hydroxybutyl methacrylate, 2-methoxyethyl acrylate, 2-methoxyethyl methacrylate, 2-phenoxyethyl acrylate, 2-phenoxyethyl methacrylate, 2-butoxyethyl acrylate, and 2-butoxyethyl methacrylate.

The thermal initiator includes 2,2'-azobisisobutyronitrile (AIBN), benzoyl peroxide (BPO), tert-Butyl hydroperoxide, tert-butyl peroxide, and tert-butyl peroxybenzoate.

Preferred examples of the copolymer include a copolymer of benzyl methacrylate, methacrylic acid and styrene, copolymer of benzyl methacrylate, methacrylic acid and α-styrene, copolymer of benzyl methacrylate, methacrylic acid and 2-hydroxyethyl methacrylate, and copolymer of benzyl methacrylate, methacrylic acid and 2-butoxyethyl methacrylate.

The average molecular weight in terms of polystyrene measured by gel permeation chromatography (GPC; tetrahydrofuran used as an elution solvent) of each binder composition for a black matrices should preferably be between 3,000 and 300,000, and particularly preferably be between 5,000 and 100,000.

Components used for ordinary photopolymerization initiators (for example, radical generators, sensitizers, etc.) may be used in the photopolymerization initiator. Acetophenone compounds can be used as radical generators and benzophenone based compounds can be used as sensitizers. Examples of acetophenone compounds include 2-hydroxy-2-methyl-1-phenylpropan-1-one, 2-2hydroxy-2-methyl-1-phenylbutan-1-one, 2-dimethylamino-2-methyl-1-phenylpropan-1-one, 2-diethylamino-2-methyl-1-phenylpropan-1-one. Examples of benzophenone based compounds include benzophenone, 2,4,6-trimethyl-benzophenone, 4-phenylbenzophenone, 4-benzoyl-4'-emthyldiphenyl sulfide, 4,4'-bis(dimethylamino)benzophenone, and 4,4'-bis(diethylamino)benzophenone.

Illustrative examples of the cross-linkable monomer include compound having an ethylenically unsaturated group such as: alkyl (meth)acrylates such as emthyl (meth)acrylate, ethyl (meth)acrylate, propyl(meth)acrylate, n-butyl (meth) acrylate, isobutyl (meth)acrylate; alicyclic (meth)acrylate such as cyclohexyl (meth)acrylate, bornyl (meth)acrylate, isobornyl (meth)acrylate, dicyclopentenyl (meth)acrylate; aromatic (meth)acrylates such as benzyl (meth)acrylate, nonylphenyl (meth)acrylate, phenyl (meth)acrylate; (meth)acrylates having a hydroxyl group, such as 2-hydroxyethyl (meth) acrylate, hydroxypropyl (meth)acrylate; di(meth)acrylates such as ethylene glycol di(meth)acrylate, diethylene glycol di(meth)acrylate, triethylene glycol di(meth)acrylate.

The organic solvent is not particularly limited, so long as it dissolves or disperses the above-mentioned respective components that constitute the photosensitive composition for color filter black matrices. Specific examples thereof include methanol, ethanol, isopropanol, toluene, xylene, ethylbenzene, cyclohexane, isophorone, cellosolve acetate, diethylene glycol dimethyl ether, ethylene glycol diethyl ether, methyl cellosolve, ethyl cellosolve, butyl cellosolve, propylene glycol monomethyl ether, propylene glycol monomethyl ether acetate, propylene glycol monomethyl ether acetate, diethylene glycol ethyl ether acetate, methyl methoxypropionate, ethyl methoxypropionate, methyl ethoxypropionate, ethyl ethoxypropionate, ethyl acetate, isoamyl acetate, ethyl lactate, acetone, methyl ketone, cyclohexanone, N,N-dimethylformamide, and N-methylpyrrolidone. They may be used singly or two or combination of them.

The black pigment can be selected from the group consisting of carbon black, acetylene black, lamp black, graphite, iron black, aniline black, cyanine black, titanium black or mixture of red, green and blue pigments. Particularly preferred is the black pigment carbon black in the view of its light shielding ratio and image characteristics.

The present polymer binder in accordance with the preferred embodiment can be etched in a desired time in the development process for making the black matrices, and thus can increase the accepting rate (i.e. the number of products accepted during quality control) of the color filters. Additionally, the polymer binder has good binding property for carbon black and great adhesion strength to the substrate that it is disposed on.

A method for synthesizing the binder composition will become apparent from the following detailed examples:

SYNTHESIS EXAMPLE1

In a four-neck reaction flask equipped with a dropping funnel, a thermometer, a reflux condenser with nitrogen flow, and a stirrer, 43 parts by mass of benzyl methacrylate, 7 parts by mass of methacrylic acid, 0.5 parts by mass of 2,2'-Azobisisobutyronitrile, 0.4 parts by mass of iso octyl 3-mercaptopropionate were dissolved in 50 parts by mass of cyclohexanone, and the inside of the four-necked flask was purged with nitrogen for about one hour. Furthermore, the temperature was elevated to 75° C. in an oil bath. After polymerization was performed for 1 hour, 40 parts by mass of tetrahydrofuran was added into the four-neck reaction flask, and then the mixture was purified in 600 parts by mass of hexanes. The obtained copolymer had an acid value of 83 mgKOH/g.

SYNTHESIS EXAMPLE 2

In a four-neck reaction flask equipped with a dropping funnel, a thermometer, a reflux condenser with nitrogen flow, and a stirrer, 41 parts by mass of benzyl methacrylate, 8 parts by mass of methacrylic acid, 4 parts by mass of α-methyl styrene, 0.5 parts by mass of 2,2'-Azobisisobutyronitrile, 0.4 parts by mass of iso octyl 3-mercaptopropionate were dissolved in 50 parts by mass of cyclohexanone, and the inside of the four-necked flask was purged with nitrogen for about one hour. Furthermore, the temperature was elevated to 75° C. in an oil bath. After polymerization was performed for 1 hour, 40 parts by mass of tetrahydrofuran was added into the four-neck reaction flask, and then the mixture was purified in 600 parts by mass of hexanes. The obtained copolymer had an acid value of 80 mgKOH/g.

SYNTHESIS EXAMPLE3

In a four-neck reaction flask equipped with a dropping funnel, a thermometer, a reflux condenser with nitrogen flow, and a stirrer, 40 parts by mass of benzyl methacrylate, 7 parts by mass of methacrylic acid, 5 parts by mass of 2-hydroxyethyl methacrylate, 0.5 parts by mass of 2,2'-Azobisisobutyronitrile, 0.4 parts by mass of iso octyl 3-mercaptopropionate were dissolved in 50 parts by mass of cyclohexanone, and the inside of the four-necked flask was purged with nitrogen for about one hour. Furthermore, the temperature was elevated to 75° C. in an oil bath. After polymerization was performed for 1 hour, 40 parts by mass of tetrahydrofuran was added into the four-neck reaction flask, and then the mixture was purified in 600 parts by mass of hexanes. The obtained copolymer had an acid value of 86 mgKOH/g.

SYNTHESIS EXAMPLE4

In a four-neck reaction flask equipped with a dropping funnel, a thermometer, a reflux condenser with nitrogen flow, and a stirrer, 41 parts by mass of benzyl methacrylate, 8 parts by mass of methacrylic acid, 4 parts by mass of styrene, 0.5 parts by mass of 2,2'-Azobisisobutyronitrile, 0.4 parts by mass of iso octyl 3-mercaptopropionate were dissolved in 50 parts by mass of cyclohexanone, and the inside of the four-necked flask was purged with nitrogen for about one hour. Furthermore, the temperature was elevated to 75° C. in an oil bath. After polymerization was performed for 1 hour, 40 parts by mass of tetrahydrofuran was added into the four-neck reaction flask, and then the mixture was purified in 600 parts by mass of hexanes. The obtained copolymer had an acid value of 86 mgKOH/g.

SYNTHESIS EXAMPLE5

In a four-neck reaction flask equipped with a dropping funnel, a thermometer, a reflux condenser with nitrogen flow, and a stirrer, 35 parts by mass of benzyl methacrylate, 8 parts by mass of methacrylic acid, 9 parts by mass of 2-hydroxyethyl methacrylate, 0.5 parts by mass of 2,2'-Azobisisobutyronitrile, 0.4 parts by mass of iso octyl 3-mercaptopropionate were dissolved in 50 parts by mass of cyclohexanone, and the inside of the four-necked flask was purged with nitrogen for about one hour. Furthermore, the temperature was elevated to 75° C. in an oil bath. After polymerization was performed for 1 hour, 40 parts by mass of tetrahydrofuran was added into the four-neck reaction flask, and then the mixture was purified in 600 parts by mass of hexanes. The obtained copolymer had a molecular weight of 40,000 in terms of polystyrene as measured by GPC.

SYNTHESIS EXAMPLE6

In a four-neck reaction flask equipped with a dropping funnel, a thermometer, a reflux condenser with nitrogen flow, and a stirrer, 40 parts by mass of benzyl methacrylate, 7 parts by mass of methacrylic acid, 5 parts by mass of 2-hydroxyethyl methacrylate, 0.5 parts by mass of 2,2'-Azobisisobutyronitrile, 1 mass part of iso octyl 3-mercaptopropionate were dissolved in 50 parts by mass of cyclohexanone, and the inside of the four-necked flask was purged with nitrogen for about one hour. Furthermore, the temperature was elevated to 75° C. in an oil bath. After polymerization was performed for 1 hour, 40 parts by mass of tetrahydrofuran was added into the four-neck reaction flask, and then the mixture was purified in 600 parts by mass of hexanes. The obtained copolymer had a weight molecular weight of 22,000 in terms of polystyrene as measured by GPC.

SYNTHESIS EXAMPLE7

In a four-neck reaction flask equipped with a dropping funnel, a thermometer, a reflux condenser with nitrogen flow, and a stirrer, 40 parts by mass of benzyl methacrylate, 7 parts by mass of methacrylic acid, 5 parts by mass of 2-hydroxyethyl methacrylate, 0.5 parts by mass of 2,2'-Azobisisobutyronitrile, 1.5 parts by mass of iso octyl 3-mercaptopropionate were dissolved in 50 parts by mass of cyclohexanone, and the inside of the four-necked flask was purged with nitrogen for about one hour. Furthermore, the temperature was elevated to 75° C. in an oil bath. After polymerization was performed for 1 hour, 40 parts by mass of tetrahydrofuran was added into the four-neck reaction flask, and then the mixture was purified in 600 parts by mass of hexanes. The obtained copolymer had a molecular weight of 14,000 in terms of polystyrene as measured by GPC.

SYNTHESIS EXAMPLE8

In a four-neck reaction flask equipped with a dropping funnel, a thermometer, a reflux condenser with nitrogen flow, and a stirrer, 30 parts by mass of benzyl methacrylate, 8 parts by mass of methacrylic acid, 15 parts by mass of 2-hydroxyethyl methacrylate, 0.5 parts by mass of 2,2'-Azobisisobutyronitrile, 0.4 parts by mass of iso octyl 3-mercaptopropionate were dissolved in 50 parts by mass of cyclohexanone, and the inside of the four-necked flask was purged with nitrogen for about one hour. Furthermore, the temperature was elevated to 75° C. in an oil bath. After polymerization was performed for 1 hour, 40 parts by mass of tetrahydrofuran was added into the four-neck reaction flask, and then the mixture was purified in 600 parts by mass of hexanes.

SYNTHESIS EXAMPLE9

In a four-neck reaction flask equipped with a dropping funnel, a thermometer, a reflux condenser with nitrogen flow, and a stirrer, 40 parts by mass of benzyl methacrylate, 7 parts by mass of methacrylic acid, 5 parts by mass of 2-butoxyethyl methacrylate, 0.5 parts by mass of 2,2'-Azobisisobutyronitrile, 0.4 parts by mass of iso octyl 3-mercaptopropionate were dissolved in 50 parts by mass of cyclohexanone, and the inside of the four-necked flask was purged with nitrogen for about one hour. Furthermore, the temperature was elevated to 75° C. in an oil bath. After polymerization was performed for 1 hour, 40 parts by mass of tetrahydrofuran was added into the four-neck reaction flask, and then the mixture was purified in 600 parts by mass of hexanes.

In summary, the parts by mass of compositions of the binder of SYNTHESIS EXAMPLE 1-9 are shown in Table 1. The weight percent of compositions of the binder of SYNTHESIS EXAMPLE 1-9 are shown in Table 2.

TABLE 1

| parts by mass of compositions of the binder of SYNTHESIS EXAMPLE 1-9 | | | | | | | | | |
|---|---|---|---|---|---|---|---|---|---|
| compositions of the binder (parts by mass) | EX. 1 | EX. 2 | EX. 3 | EX. 4 | EX. 5 | EX. 6 | EX. 7 | EX. 8 | EX. 9 |
| M1: .alpha.-methyl styrene | | 4 | | | | | | | |
| M1: styrene | | | | 4 | | | | | |
| M2: benzyl methacrylate | 43 | 41 | 40 | 41 | 35 | 40 | 40 | 30 | 40 |
| M3: methacrylic acid | 7 | 8 | 7 | 8 | 8 | 7 | 7 | 8 | 7 |
| M4: 2-hydroxyethyl methacrylate | | | 5 | | 9 | 5 | 5 | 15 | |
| M4: 2-butoxyethyl methacrylate | | | | | | | | | 5 |
| thermal initiator: 2,2'-Azobisisobutyronitrile | 0.5 | 0.5 | 0.5 | 0.5 | 0.5 | 0.5 | 0.5 | 0.5 | 0.5 |
| iso octyl 3-mercaptopropionate | 0.4 | 0.4 | 0.4 | 0.4 | 0.4 | 1 | 1.5 | 0.4 | 0.4 |
| Total (Parts) | 50.9 | 53.9 | 52.9 | 53.9 | 52.9 | 53.5 | 54 | 53.9 | 52.9 |

TABLE 2 weight percent of compositions of the binder of SYNTHESIS EXAMPLE 1-9

| compositions of the binder (weight percent) | EX. 1 | EX. 2 | EX. 3 | EX. 4 | EX. 5 | EX. 6 | EX. 7 | EX. 8 | EX. 9 |
|---|---|---|---|---|---|---|---|---|---|
| M1 (%) |  | 7.4% |  | 7.4% |  |  |  |  |  |
| M2: (%) | 84.5% | 76.1% | 75.6% | 76.1% | 66.2% | 74.8% | 74.1% | 55.7% | 75.6% |
| M3: (%) | 13.8% | 14.8% | 13.2% | 14.8% | 15.1% | 13.1% | 13.0% | 14.8% | 13.2% |
| M4 (%) |  |  | 9.5% |  | 17.0% | 9.3% | 9.3% | 27.8% | 9.5% |
| thermal initiator: 2,2'-Azobisisobutyronitrile | 1.0% | 0.9% | 0.9% | 0.9% | 0.9% | 0.9% | 0.9% | 0.9% | 0.9% |
| iso octyl 3-mercaptopropionate | 0.8% | 0.7% | 0.8% | 0.7% | 0.8% | 1.9% | 2.8% | 0.7% | 0.8% |

Referring to the following table 3 of SYNTHESIS EXAMPLE 10-18, in a four-neck reaction flask equipped with a dropping funnel, a thermometer, a reflux condenser with nitrogen flow, and a stirrer, the compositions follow the table 2 were dissolved in 50 parts by mass of cyclohexanone, and the inside of the four-necked flask was purged with nitrogen for about one hour. Furthermore, the temperature was elevated to 75 degrees C. in an oil bath. After polymerization was performed for 1 hour, 40 parts by mass of tetrahydrofuran was added into the four-neck reaction flask, and then the mixture was purified in 600 parts by mass of hexanes. The parts by mass of compositions of the binder of SYNTHESIS EXAMPLE 10-18 are shown in Table 3. The weight percent of compositions of the binder of SYNTHESIS EXAMPLE 10-18 are shown in Table 4.

TABLE 3 parts by mass of compositions of the binder SYNTHESIS EXAMPLE 10-18

| compositions of the binder (parts by mass) | EX. 10 | EX. 11 | EX. 12 | EX. 13 | EX. 14 | EX. 15 | EX. 16 | EX. 17 | EX. 18 |
|---|---|---|---|---|---|---|---|---|---|
| M1: m-methoxystyrene |  | 4 |  |  |  |  |  |  |  |
| M1: styrene |  |  |  | 3 |  |  |  |  |  |
| M2: benzyl acrylate | 43 | 41 | 40 | 41 | 35 | 40 | 40 | 30 | 40 |
| M2: acrylic acid |  | 8 |  | 8 |  | 7 |  |  |  |
| M3: methacrylic acid | 7 |  | 6 |  | 5 |  | 7 | 8 | 7 |
| M4: 2-hydroxyethyl acrylate | 3 |  | 5 | 3 | 4 | 5 | 5 | 15 |  |
| M4: 2-methoxyethyl acrylate |  |  |  | 3 | 5 |  |  |  | 5 |
| Thermal Initiator: 2,2'-Azobisisobutyronitrile | 0.5 |  | 1 |  | 0.5 | 0.7 | 1 | 2 | 3 |
| Thermal Initiator: benzoyl peroxide (BPO) | 0.1 | 0.3 |  | 0.55 |  |  |  |  |  |
| iso octyl 3-mercaptopropionate | 0.1 | 0.4 | 5.5 | 0.4 | 0.4 | 1 | 1.5 | 0.4 | 0.4 |
| Total (Parts) | 53.7 | 53.7 | 57.5 | 58.95 | 49.9 | 53.7 | 54.5 | 55.4 | 55.4 |

TABLE 4 weight percent of compositions of the binder SYNTHESIS EXAMPLE 10-18

| compositions of the binder (weight percent) | EX. 10 | EX. 11 | EX. 12 | EX. 13 | EX. 14 | EX. 15 | EX. 16 | EX. 17 | EX. 18 |
|---|---|---|---|---|---|---|---|---|---|
| M1 (%) |  | 7.45% |  | 15.27% |  |  |  |  |  |
| M2: (%) | 80.07% | 76.35% | 69.57% | 69.55% | 70.14% | 74.49% | 73.39% | 54.15% | 72.20% |
| M3: (%) | 13.04% | 14.90% | 10.43% | 13.57% | 10.02% | 13.04% | 12.84% | 14.44% | 12.64% |
| M4 (%) | 5.59% |  | 8.70% |  | 18.04% | 9.31% | 9.17% | 27.08% | 9.03% |
| thermal Initiator | 1.12% | 0.56% | 1.74% | 0.93% | 1.00% | 1.30% | 1.83% | 3.61% | 5.42% |
| iso octyl 3-mercaptopropionate | 0.19% | 0.74% | 9.57% | 0.68% | 0.80% | 1.86% | 2.75% | 0.72% | 0.72% |

What is claimed is:

1. A binder composition for black matrices, the binder composition comprising a copolymer obtained by polymerizing for four different monomers without a macro monomer in the presence of an iso octyl 3-mercaptopropionate and a thermal initiator, wherein the four monomers comprising:

a monomer M1, wherein the monomer M1 is in the range from about 7.45% to about 27.08%;
a monomer M2, wherein a weight percentage of the monomer M2 in the range from about 54.15% to about 84.5%;
a monomer M3, wherein a weight percentage of the monomer M3 is in the range from about 10.02% to about 15.1%;
a monomer M4, wherein a weight percentage of the monomer M4 is in the range from about 5.59% to about 27.08%;
wherein a weight percentage of the iso octyl 3-mercaptopropionate is in the range from about 0.7% to about 9.57%; and a weight percentage of the thermal initiator is in the range from about 0.56% to about 5.42%; the monomer M1 is represented by the following formula:

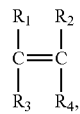

the monomers M2, M3 and M4 are represented by the following formula:

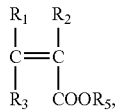

wherein R1, R2, R3 are selected from the group consisting of hydrogen and alkyl group; R4 is an aromatic group; R5 is selected from the group consisting of hydrogen, aromatic group, alkyl group, substituted alkyl group, and alkyl group interrupted by oxygen atom.

2. The binder composition for black matrices as claimed in claim 1, wherein the monomer M1 is selected from the group consisting of styrene, α-methylstyrene, o-vinyltoluene, m-vinyltoluene, p-vinyltoluene, p-chlorostyrene, o-methoxystyrene, m-methoxystyrene, p-methoxystyrene, o-vinylbenzyl methyl ether, m-vinylbenzyl methyl ether, p-vinylbenzyl methyl ether, o-vinylbenzyl methyl ether, m-vinylbenzyl glycidyl ether, and p-vinylbenzyl glycidyl ether.

3. The binder composition for black matrices as claimed in claim 1, wherein the monomer M2 is selected from the group consisting of benzyl acrylate and benzyl methacrylate.

4. The binder composition for black matrices as claimed in claim 1, wherein the monomer M3 is selected from the group consisting of acrylic acid, methacrylic acid, crotonic acid, α-chloroacrylic acid, and cinnamic acid.

5. The binder composition for black matrices as claimed in claim 1, wherein the monomer M4 is selected from the group consisting of 2-hydroxyethyl acrylate, 2-hydroxyethyl methacrylate, 2-hydroxypropyl acrylate, 2-hydroxypropyl methacrylate, 3-hydroxypropyl acrylate, 3-hydroxypropyl methacrylate, 3-hydroxypropyl acrylate, 3-hydroxypropyl methacrylate, 2-hydroxybutyl acrylate, 2-hydroxylbutyl methacrylate, 3-hydroxybutyl acrylate, 3-hydroxybutyl methacrylate, 4-hydroxybutyl acrylate, 4-hydroxybutyl methacrylate, 2-methoxyethyl acrylate, 2-methoxyethyl methacrylate, 2-phenoxyethyl acrylate, 2-phenoxyethyl methacrylate, 2-butoxyethyl acrylate, and 2-butoxyethyl methacrylate.

6. The binder composition for black matrices as claimed in claim 1, wherein the thermal initiator is selected from the group consisting of 2,2'-azobisisobutyronitrile (AIBN), benzoyl peroxide (BPO), tert-Butyl hydroperoxide, tert-butyl peroxide, and tert-butyl peroxybenzoate.

7. A photosensitive composition for black matrices, comprising:

a binder composition comprising a copolymer obtained by polymerizing four different monomers without a macro monomer in the presence of an iso octyl 3-mercaptopropionate and a thermal initiator, wherein the four monomers comprising:
a monomer M1, wherein the monomer M1 is in the range from about 7.45% to about 27.08%,
a monomer M2, wherein and a weight percentage of the monomer M2 in the range from about 54.15% to about 84.5%,
a monomer M3, wherein a weight percentage of the monomer M3 is in the range from about 10.02% to about 15.1%,
a monomer M4, wherein a weight percentage of the monomer M4 is in the range from about 5.59% to about 27.08%,
a photopolymerization initiator;
a cross-linkable monomer;
an organic solvent; and
a black pigment,
wherein a weight percentage of the iso octyl 3-mercaptopropionate is in the range from about 0.7% to about 9.57%; a weight percentage of the thermal initiator is in the range from about 0.56% to about 5.42%; the monomer M1 is represented by the following formula:

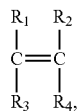

the monomers M2, M3 and M4 are represented by the following formula:

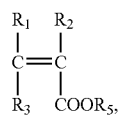

wherein R1, R2, R3 are selected from the group consisting of hydrogen and alkyl group; R4 is an aromatic group; R5 is selected from the group consisting of hydrogen, aromatic group, alkyl group, substituted alkyl group, and alkyl group interrupted by oxygen atom.

8. The photosensitive composition for black matrices as claimed in claim 7, wherein the monomer M1 is selected from the group consisting of styrene, α-methylstyrene, o-vinyltoluene, m-vinyltoluene, p-vinyltoluene, p-chlorostyrene, o-methoxystyrene, m-methoxystyrene, p-methoxystyrene, o-vinylbenzyl methyl ether, m-vinylbenzyl methyl ether, p-vinylbenzyl methyl ether, o-vinylbenzyl methyl ether, m-vinylbenzyl glycidyl ether, and p-vinylbenzyl glycidyl ether.

9. The photosensitive composition for black matrices as claimed in claim 7, wherein the monomer M2 is selected from the group consisting of benzyl acrylate, and benzyl methacrylate.

10. The photosensitive composition for black matrices as claimed in claim 7, wherein the monomer M3 is selected from the group consisting of acrylic acid, methacrylic acid, crotonic acid, α-chloroacrylic acid, and cinnamic acid.

11. The photosensitive composition for black matrices as claimed in claim 7, wherein the monomer M4 is selected from the group consisting of 2-hydroxyethyl acrylate, 2-hydroxyethyl methacrylate, 2-hydroxypropyl acrylate, 2-hydroxypropyl methacrylate, 3-hydroxypropyl acrylate, 3-hydroxypropyl methacrylate, 3-hydroxypropyl acrylate, 3-hydroxypropyl methacrylate, 2-hydroxybutyl acrylate, 2-hydroxylbutyl methacrylate, 3-hydroxybutyl acrylate, 3-hydroxybutyl methacrylate, 4-hydroxybutyl acrylate, 4-hydroxybutyl methacrylate, 2-methoxyethyl acrylate, 2-methoxyethyl methacrylate, 2-phenoxyethyl acrylate, 2-phenoxyethyl methacrylate, 2-butoxyethyl acrylate, and 2-butoxyethyl methacrylate.

12. The photosensitive composition for black matrices as claimed in claim 7, wherein the thermal initiator is selected from the group consisting of 2,2'-azobisisobutyronitrile (AIBN), benzoyl peroxide (BPO), tert-Butyl hydroperoxide, tert-butyl peroxide, and tert-butyl peroxybenzoate.

13. The photosensitive composition for black matrices as claimed in claim 7, wherein the black pigment is selected from the group consisting of carbon black, acetylene black, lamp black, graphite, iron black, aniline black, cyanine black, titanium black, and a mixture of red, green and blue pigments.

14. The photosensitive composition for black matrices as claimed in claim 7, wherein the photopolymerization initiator is selected from the group consisting of 2-hydroxy-2-methyl-1-phenylpropan-1-one, 2-hydroxy-2-methyl-1-phenylbutan-1-one, 2-dimethylamino-2-methyl-1-phenylpropan-1-one, 2-diethylamino-2-methyl-1-phenylpropan-1-one, benzophenone, 2,4,6-trimethyl-benzophenone, 4-phenylbenzophenone, 4-benzoyl-4'-methyldiphenyl sulfide, 4,4'-bis(dimethylamino)benzophenone, and 4,4'-bis(diethylamino)benzophenone.

15. The photosensitive composition for black matrices as claimed in claim 7, wherein the cross-linkable monomer is selected from the group consisting of alkyl (meth)acrylates, alicyclic (meth)acrylate, aromatic (meth)acrylates, (meth)acrylates having a hydroxyl group, and di(meth)acrylates;
the alkyl (meth)acrylates is selected from the group consisting of methyl (meth)acrylate, ethyl (meth)acrylate, propyl(meth)acrylate, n-butyl (meth)acrylate, and isobutyl (meth)acrylate;
the alicyclic (meth)acrylate is selected from the group consisting of cyclohexyl (meth)acrylate, bornyl (meth)acrylate, isobornyl (meth)acrylate, and dicyclopentenyl (meth)acrylate;
the aromatic (meth)acrylates comprises benzyl (meth)acrylate, nonylphenyl (meth)acrylate, and phenyl (meth)acrylate;
the (meth)acrylates having a hydroxyl group and is selected from the group consisting of 2-hydroxyethyl (meth)acrylate,and hydroxypropyl (meth)acrylate;
the di(meth)acrylates is selected from the group consisting of ethylene glycol di(meth)acrylate, diethylene glycol di(meth)acrylate, and triethylene glycol di(meth)acrylate.

* * * * *